(12) United States Patent
Pikus

(10) Patent No.: US 10,908,511 B2
(45) Date of Patent: Feb. 2, 2021

(54) SYSTEMS AND METHODS FOR PATTERNING COLOR ASSIGNMENT

(71) Applicant: Mentor Graphics Corporation, Wilsonville, OR (US)

(72) Inventor: Fedor G. Pikus, Beaverton, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 364 days.

(21) Appl. No.: 15/958,511

(22) Filed: Apr. 20, 2018

(65) Prior Publication Data

US 2019/0325612 A1    Oct. 24, 2019

(51) Int. Cl.
 *G03F 7/00* (2006.01)
 *G03F 7/20* (2006.01)
 *G06T 7/90* (2017.01)
 *G06F 30/398* (2020.01)

(52) U.S. Cl.
 CPC ...... *G03F 7/70466* (2013.01); *G03F 7/70433* (2013.01); *G06F 30/398* (2020.01); *G06T 7/90* (2017.01)

(58) Field of Classification Search
 CPC ............. G03F 7/70466; G03F 7/70433; G06F 30/398; G06T 7/90
 See application file for complete search history.

(56) References Cited

U.S. PATENT DOCUMENTS

| 8,484,607 | B1 * | 7/2013 | Tang ................... G03F 7/70466 |
| | | | 716/136 |
| 9,098,670 | B2 * | 8/2015 | Song ..................... G06F 30/392 |
| 9,335,624 | B2 * | 5/2016 | Lee .......................... G06F 30/39 |
| 9,514,266 | B2 * | 12/2016 | Tsai ....................... G03F 7/0035 |
| 9,754,072 | B1 * | 9/2017 | Salowe .................... G06F 30/39 |
| 10,223,496 | B2 * | 3/2019 | Lvov .................... G06F 30/398 |
| 10,274,829 | B2 * | 4/2019 | Hsieh .................. G03F 7/70466 |
| 10,354,886 | B2 * | 7/2019 | Cilingir ............... G03F 7/70466 |
| 2015/0234974 | A1 * | 8/2015 | Dechene .................... G03F 1/70 |
| | | | 716/52 |

* cited by examiner

*Primary Examiner* — Naum Levin

(57) ABSTRACT

Systems and methods for multi-patterning in layout design data. A method includes receiving a coloring rule by a computer system. The method includes applying the coloring rule to the layout design data to identify a unique uncolored geometric element corresponding to the rule, by the computer system. The method includes, when the applied rule did not identify the unique uncolored geometric element corresponding to the rule, repeat the receiving and applying processes with a different coloring rule. The method includes, when the applied rule did identify the unique uncolored geometric element corresponding to the rule, assigning a patterning color to the unique uncolored geometric element, by the computer system.

20 Claims, 6 Drawing Sheets

SYSTEMS AND METHODS FOR PATTERNING COLOR ASSIGNMENT

TECHNICAL FIELD

The disclosed technology is directed techniques for semiconductor design, including coloring schemes and constraints for patterning clusters in a multiple-patterning scheme for layout design data, and identification of elements in the layout design data.

BACKGROUND OF THE DISCLOSURE

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows. Initially, the specification for the new microcircuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, channels, gates, etc.) making up the circuit. While the geometric elements are typically polygons, other shapes, such as circular and elliptical shapes, may be employed. These geometric elements may be custom designed, selected from a library of previously-created designs, or some combination of both. Geometric elements also are added to form the connection lines that will interconnect these circuit devices. Layout tools (often referred to as "place and route" tools), such as IC Station available from Mentor Graphics® Corporation of Wilsonville, Oreg. or Virtuoso available from Cadence® Design Systems of San Jose, Calif., are commonly used for both of these tasks.

With a layout design, each physical layer of the microcircuit will have a corresponding layer representation in the layout design data, and the geometric elements described in a layer representation will define the relative locations of the circuit device components that will make up a circuit device. Thus, the geometric elements in the representation of an implant layer will define the regions where doping will occur, while the geometric elements in the representation of a metal layer may define the locations in a metal layer where conductive wires will be formed to connect the circuit devices. Typically, a designer will perform a number of analyses on the layout design. For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, etc. This analysis is sometimes referred to as "physical verification."

After the layout design has been finalized, then it is converted into a format that can be employed by a mask or reticle writing tool to create a mask or reticle for use in a photolithographic manufacturing process. Masks and reticles are typically made using tools that expose a blank reticle to an electron or laser beam. Most mask writing tools are able to only "write" certain kinds of polygons, however, such as right triangles, rectangles or other trapezoids. Moreover, the sizes of the polygons are limited physically by the maximum beam aperture size available to the tool. Accordingly, larger geometric elements in the layout design, or geometric elements that are not basic right triangles, rectangles or trapezoids (which typically is a majority of the geometric elements in a layout design) must be "fractured" into the smaller, more basic polygons that can be written by the mask or reticle writing tool.

Once the layout design has been fractured, then the layout design data can be converted to a format compatible with the mask or reticle writing tool. Examples of such formats are MEBES, for raster scanning machines manufactured by ETEC, an Applied Materials Company, the ".MIC" format from Micronics AB in Sweden, and various vector scan formats for Nuflare, JEOL, and Hitachi machines, such as VSB12 or VSB12. The written masks or reticles can then be used in a photolithographic process to expose selected areas of a wafer in order to produce the desired integrated circuit devices on the wafer.

To meet the demand for more powerful microdevices, designers have regularly increased the average density of their structures. For example, the area of an integrated circuit that might once have contained 100 transistors may now be required to contain 1,000 or even 10,000 transistors. Some current microdevice designs call for microdevice structures to be packed so closely that it may be difficult to properly manufacture adjacent structures in a single lithographic process. For example, a current microcircuit design may specify a series of parallel conductive lines positioned so closely that a conventional mask writer cannot resolve the pitch between the lines.

To address this issue, the structures in a layer of a microcircuit device are now sometimes formed using two or more separate lithographic processes. This technique, referred to as "double patterning" (or "triple-patterning," "multiple patterning," etc.), partitions a layout design into two or more groups or "colors," each of which is then used to form a complementary lithographic mask pattern. Thus, if a layout design calls for a series of closely-spaced parallel connective lines, this target pattern may be partitioned so that adjacent lines are actually formed by different masks in separate lithographic processes. A "color" refers to an assignment to a group corresponding to a specific lithographic mask. For example, in a double patterning implementation, the elements in the layout design data are divided into two "color" groups, generally referred to by number, such as color "0" and color "1." Each color refers to the elements that are associated with a specific respective lithographic mask. As that term is used herein, "color" may refer to any indicator that is used to associate a geometric or other element as described herein with a corresponding lithographic mask for a semiconductor layer.

While double patterning lithographic techniques allow for denser microdevice structures, it is sometimes difficult to implement these techniques. For example, it may be difficult to determine when the geometric elements described in layout design data (corresponding to the physical structures of the microdevice) can be correctly partitioned into two complementary sets of layout design data without creating a conflict (i.e., a situation where two or more adjacent geometric elements are too close to be formed by the same lithographic mask, but are nonetheless scheduled to be formed by the same lithographic mask).

SUMMARY OF THE DISCLOSURE

While double-patterning, triple-patterning, and higher multiple patterning provide techniques for creating microdevices with dense structures, it can be important to be able to apply patterning "colors" to layout design data in a manner that is consistent and repeatable for a given layout, even if layout design data is mirrored or differently oriented. Disclosed embodiments include techniques for an efficient, consistent, and repeatable process for applying patterning colors to geometric elements in layout design data.

Various disclosed embodiments include systems and methods for multi-patterning in layout design data. A method includes receiving a coloring rule by a computer system. The method includes applying the coloring rule to the layout design data to identify a unique uncolored geometric element corresponding to the rule, by the computer system. The method includes, when the applied rule did not identify the unique uncolored geometric element corresponding to the rule, repeat the receiving and applying processes with a different coloring rule. The method includes, when the applied rule did identify the unique uncolored geometric element corresponding to the rule, assigning a patterning color to the unique uncolored geometric element, by the computer system.

In some embodiments, the receiving, applying, and assigning processes are repeated until all geometric elements in at least a predetermined portion of the layout design data have been assigned a patterning color or until some stopping criterion is met. Some embodiments further include propagating patterning coloring assignments though other uncolored geometric elements that are connected to the unique uncolored geometric element directly or indirectly by coloring constraints. In some embodiments, the coloring rule is one of identify an uncolored anchor geometric element; identify an uncolored geometric element nearest to a hotspot; identify an uncolored geometric element nearest to a center of mass/gravity of the design layout; or identify an uncolored geometric element nearest to a specific already-colored element in the layout. In some embodiments, each time the receiving process is performed, a different coloring rule is used in a predetermined order. Some embodiments further include storing the assigned patterning colors with the layout design data.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Illustrative Operating Environment

The execution of various electronic design automation processes described herein may be implemented using computer-executable software instructions executed by one or more programmable computing devices. Because these processes may be implemented using software instructions, the components and operation of a generic programmable computer system on which various embodiments of these processes may be employed will first be described. Further, because of the complexity of some electronic design automation processes and the large size of many circuit designs, various electronic design automation tools are configured to operate on a computing system capable of simultaneously running multiple processing threads. The components and operation of a computer system having a host or master computer and one or more remote or slave computers therefore will be described with reference to FIG. 1. This operating environment is only one example of a suitable operating environment, however, and is not intended to suggest any limitation as to the scope of use or functionality of any implementations of the invention.

Figure 1:
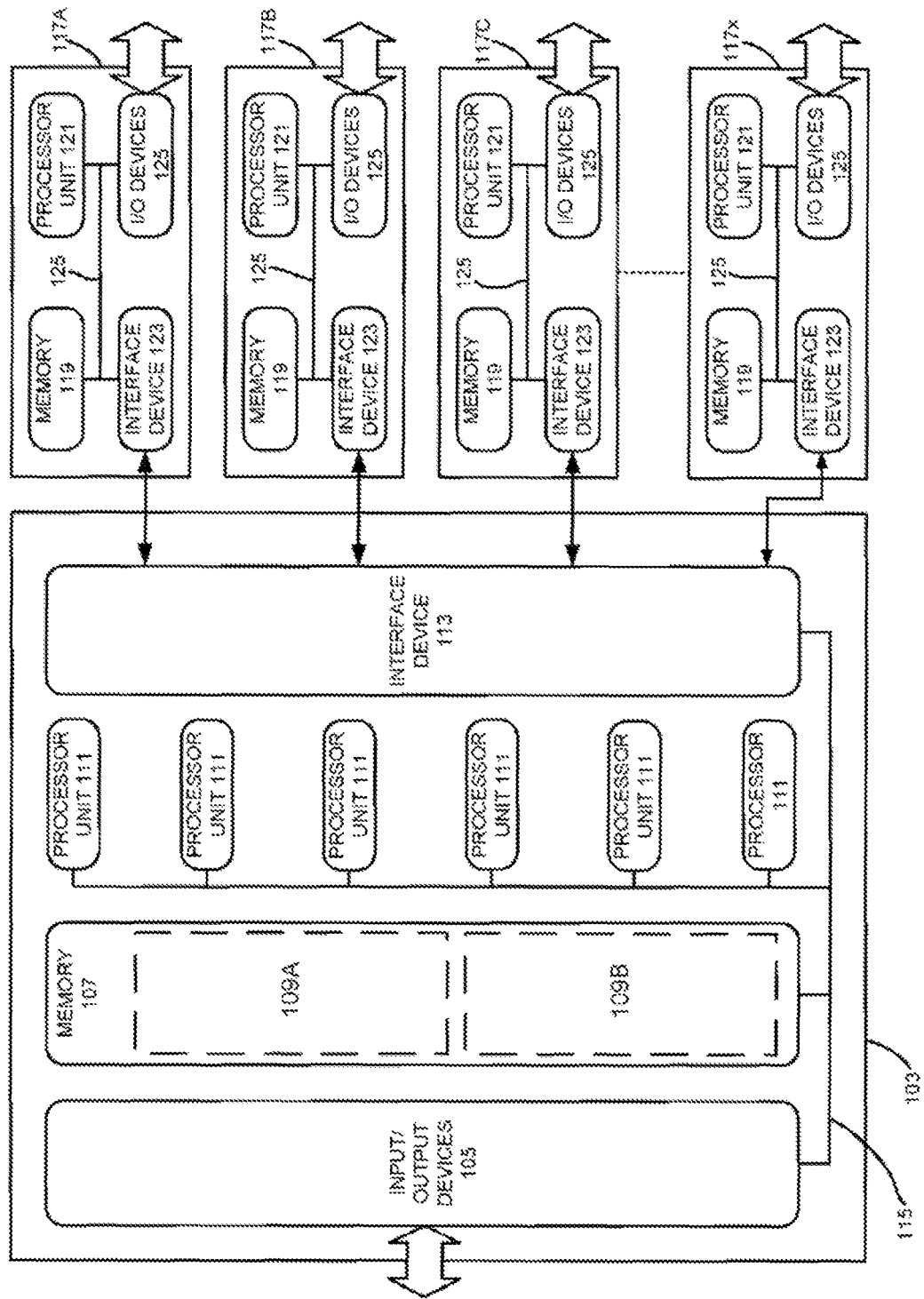
FIGS. 1 and 2 illustrate components of a computer system that may be used to implement various embodiments of the disclosed technology.

In FIG. 1, the computer system 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other non-transitory storage medium that can be used to store desired information. As used herein, the term "non-transitory" refers to the ability to store information for subsequent retrieval at a desired time, as opposed to propagating electromagnetic signals.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire®. microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
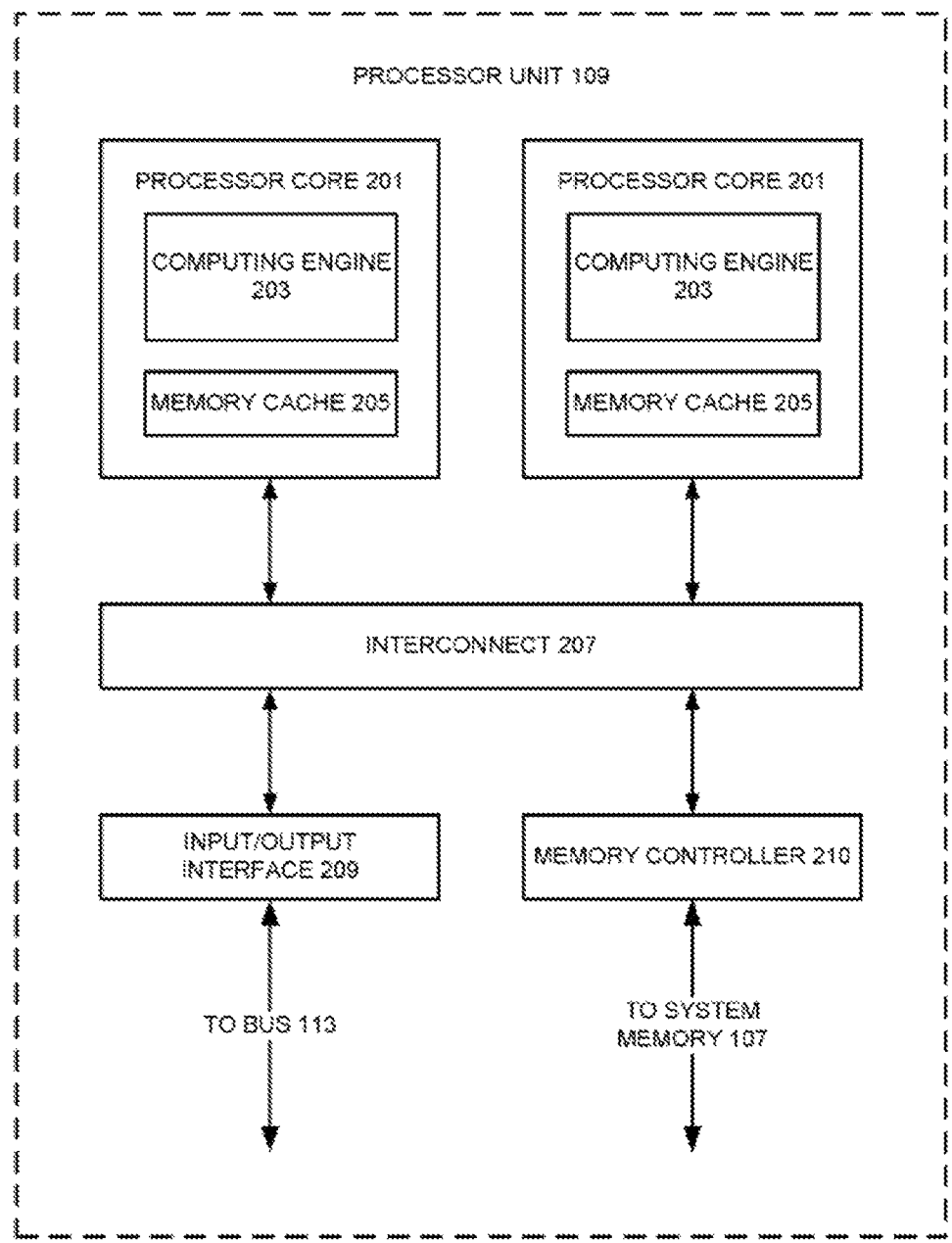

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, an alternate implementation of the computing system 101 may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 1157, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel®. Pentium®. or Xeon™ microprocessors, Advanced Micro Devices Athlon™ microprocessors or Motorola 68K/Coldfire®. microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the technology may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the computer system 101, the master computer 103 may be connected to one or more external data storage devices. These external data storage devices may be implemented using any combination of non-transitory computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the computer system 101, one or more of the slave computers 117 may alternately or additions be connected to one or more external non-transitory data storage devices. Typically, these external non-transitory data storage devices will include data storage devices that also are connected to the master computer 103, but they also may be different from any data storage devices accessible by the master computer 103.

It also should be appreciated that the description of the computer system 101 illustrated in FIG. 1 and FIG. 2 is provided as an example only, and it not intended to suggest any limitation as to the scope of use or functionality of various embodiments of the invention.

Organization of Layout Design Data

As used herein, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually in the design, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells. Of course, while the above-described example is of design data organized hierarchically based upon circuit structures, circuit design data may alternately or additionally be organized hierarchically according to any desired criteria including, for example, a geographic grid of regular or arbitrary dimensions (e.g., windows), a memory amount available for performing operations on the design data, design element density, etc.

Double and Multiple Patterning

Because of the structural density of conventional integrated circuits, a single physical layer of an integrated circuit device is now sometimes formed using two or more separate masks during a lithographic manufacturing process. For example, the geometric elements in layout design data representing a physical layer of an integrated circuit may be partitioned into two or more groups or "colors," each of which is then used to form a complementary lithographic mask. Thus, if a layout design calls for a series of closely-spaced parallel connective lines, this target pattern may be partitioned so that adjacent lines are actually formed by different masks in separate lithographic processes. This technique is referred to as "double patterning." Similarly, techniques that divide a physical layer into three sets of geometric elements, each of which is then used to form a complementary lithographic mask pattern, is referred to a "triple patterning." In general, the use two, three, four, or even more complementary masks (and complementary sets of geometric elements) are sometimes commonly referred to as multiple patterning.

Figure 3A:
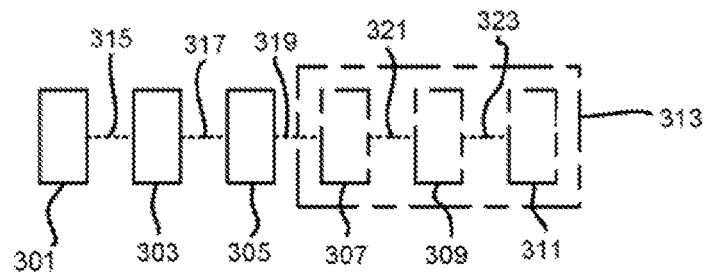
FIGS. 3A-3C illustrate the use of constraints to determine respective placement of geometric elements for complementary using a double-patterning technique in accordance with disclosed embodiments.
Figure 3B:
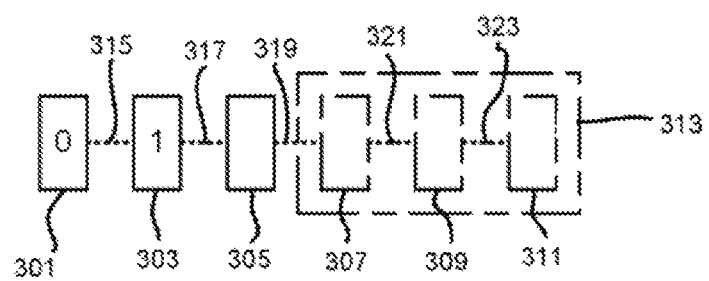

For example, FIG. 3A illustrates geometric elements 301-311, of which geometric elements 307-311 are placed within a hierarchical cell 313. In this example, the geometric elements are placed with constraints (sometimes referred to as a "separation directives") that direct geometric elements placed too closely to each other to be assigned to different lithographic masks. For example, the mask assignments of polygons 301 and 303 are controlled by a constraint 315. The constraint 315 requires that, if geometric element 301 is assigned to one mask (for example, "colored" with a value of "0"), then geometric element 303 should be assigned to another mask (for example, "colored" with a value of "1"), as shown in FIG. 3B. With various implementations of this technology, the color of a geometric element can be designated by a variety of techniques. For example, with double-patterning, a single bit associated with a geometric element can be used to designate that geometric element as being colored "0" or being colored "1."

Figure 3C:
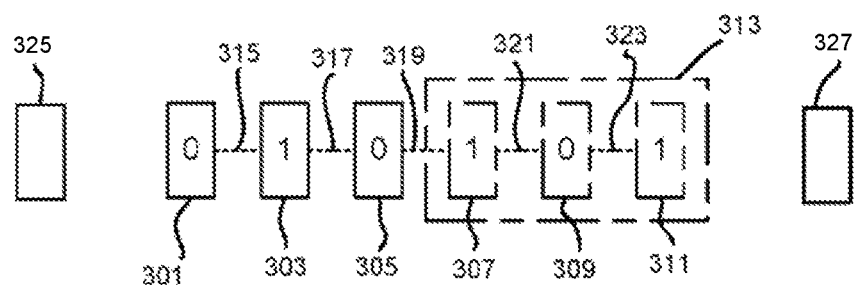

Likewise, the mask assignments of polygons 303 and 305 are controlled by a constraint 317. The constraint 317 requires that, if geometric element 303 is assigned to one mask (for example, "colored" with a value of "1", as previously noted), then geometric element 305 should be assigned to another mask (for example, "colored" with a value of "0"), as shown in FIG. 3C. Constraints 319-323 then direct the mask assignments of polygons 307-311, respectively, as shown in FIG. 3C. As seen in this figure, while geometric elements 307-311 are contained within a cell that may have many placements throughout a layout design, the mask assignment or "coloring" of these geometric elements are constrained by the local placement of geometric elements outside of the cell. Further, as seen from FIGS. 3A-3C, the geometric elements 301-311 may be seen as being "interconnected" by their constraints 315-323. A set of geometric elements interconnected by coloring constraints will be referred to herein as a patterning cluster. Geometric elements 325 and 327, shown in FIG. 3C, have no constraint relationship with any of geometric elements 307-311, and thus are not part of the patterning cluster formed by geometric elements 301-311.

Figure 4:
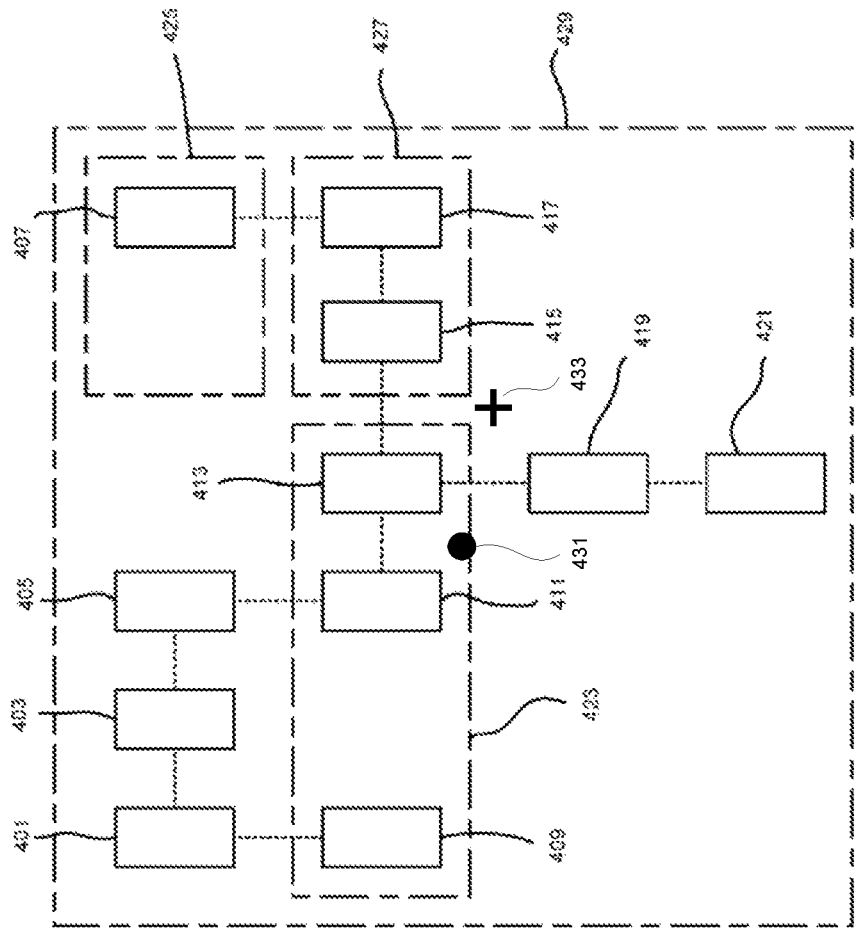
FIG. 4 illustrates an example of a patterning cluster that extends through multiple hierarchical cells in accordance with disclosed embodiments.

FIG. 4 illustrates an example of a patterning cluster that extends through multiple hierarchical cells. More particularly, this figure shows geometric elements 401-421. Of these, geometric element 407 is placed in hierarchical cell 425, geometric elements 409-413 are placed in hierarchical cell 423, and geometric elements 415 and 417 are placed in hierarchical cell 427. All of the geometric elements 401-421 (and the hierarchical cells 423-427) are placed within the higher level hierarchical cell 429. As seen in this figure, all of the geometric elements 401-421 are associated together, either directly or indirectly, by constraints (shown in FIG. 4 by dotted lines) into a single patterning cluster. Within hierarchical cell 423, however, geometric elements 411 and 413 are directly associated by a constraint, but neither of geometric elements 411 and 413 is associated with geometric element 409 by a constraint within the cell. Thus, when considering hierarchical cell 409 by itself, it appears to contain two patterning clusters: a first cluster made up of geometric element 409 alone, and a second cluster made up of geometric elements 411 and 413. As discussed herein, this type of partial patterning cluster, which appears to be an isolated cluster when viewed within a single hierarchical cell, but which is part of a larger cluster when considered within a higher hierarchical cell, will be referred to as a patterning cluster portion. Thus, hierarchical cell 423 includes two patterning cluster portions (made up of geometric element 409 and geometric elements 411 and 413), hierarchical cell 425 includes a single patterning cluster portion made up of geometric element 407, and hierarchical cell 427 includes a single patterning cluster portion made up of geometric elements 415 and 417. The higher-level hierarchical cell 429 then includes the entire patterning cluster.

FIG. 4 also illustrates that a layer of a design includes geometric elements in a two-dimensional layout. A computer system implementing a design tool or constraint generator recognizes the relative positions of each geometric element in the layer, and, for a given orientation, that various geometric elements are above, below, to the left or right, symmetric to, aligned with, or otherwise arranged in the layout with respect to each other. In various embodiments described below, the computer system can identify geometric elements or clusters by relation to each other. For example, the computer system can recognize that geometric element 405 is "above" geometric element 411 and that geometric element 413 is to the right of geometric element 411. The "knowledge" of relative positions is useful in cases, for example, where the lower-left geometric element is the "anchor" element of the design and should be "colored" to be assigned to a specific lithographic mask.

FIG. 4 also illustrates the center of mass 431 of the layout (indicated by a circle) that can be stored in the layout design data. Also shown is hotspot 433 of the layout (indicated by a cross) that can be stored in the layout design data. A lithography hotspot is a place where it is susceptible to have fatal pinching (open circuit) or bridging (short circuit) errors due to poor printability of certain patterns in a design layout. A hotspot can also refer to a pattern in a region or window of a design area, where the location of the pattern area is identified to a user by a hotspot marker. The center of mass, hotspot, and hotspot marker are useful in processes as described below.

Also, while various operations have been described above with respect to double patterning, it should be appreciated that these operations also can be applied to triple patterning and higher multiple patterning alternatives.

Figure 5:
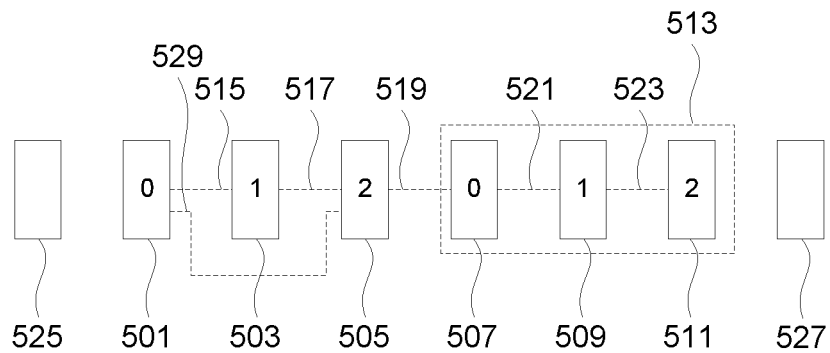
FIG. 5 illustrates triple patterning in accordance with disclosed embodiments.

For example, FIG. 5 illustrates triple patterning in accordance with disclosed embodiments. This figure shows geometric elements 501-511, of which geometric elements 507-511 are placed within a hierarchical cell 513. In this example, the geometric elements are placed with constraints 515-523 that direct geometric elements placed too closely to each other to be assigned to different lithographic masks. For example, the mask assignments of polygons 501 and 503 are controlled by a constraint 515. The constraint 515 requires that, if geometric element 501 is assigned to one mask (for example, "colored" with a value of "0"), then geometric element 503 should be assigned to another mask (for example, "colored" with a value of "1"). Similarly, constraint 517 requires that geometric element 503 be assigned a different mask (in this case, "colored" with the value of "1") than geometric element 505 (in this example, "colored" with a value of "2"). In this example, elements 525 and 527 have no constraints.

In a triple-patterning example such as this, it may be seen that a further constraint 529 can be defined to require that geometric element 501 is assigned a mask (color "0") that is different than geometric element 505 (color "2"). In a triple-patterning case, in a chain of geometric elements interconnected by constraints between neighboring elements, additional constraints between each geometric element and its second-neighbor elements (that is, two elements away in the chain) result in a coloring pattern as shown, with a strict rotation between each mask assignment (in this example, 0-1-2-0-1-2).

"Color" assignments such as those described herein cannot, in any practical sense, be manually made for each of the thousands or even millions of geometric elements. While some colors can be automatically assigned based on an anchor element, the coloring constraints as described herein, and the degree of multi-patterning (that is, double patterning, triple patterning, etc.), other elements do not have a specified manner in which they are colored. Moreover, when multiple copies of a design layout are to be manufactured, it may be important that the color assignments be consistent in each instance, to ensure consistent performance and properties. Similarly, when a design layout as a whole has multiple copies of an identical pattern in different "windows" of the layout, for example each surrounding a hotspot marker, is may be important that the color assignments for the components of each of the elements in these windows be consistent in each instance, to ensure consistent performance and properties. Other versions of the design layout or window may be rotated or mirrored, so it is difficult or impossible to ensure, in current systems, that coloring assignments are made the same way each time for a given design layout or window, even if that design layout or window is rotated, mirrored, or otherwise transformed.

Current systems attempt to address this issue using pattern-matching techniques to find matching patterns of the geometric elements in design layouts (or portions of design layouts) and to match the coloring between the matched patterns. This sort of pattern matching is both very computationally intensive and prone to error.

Disclosed embodiments provide a coloring selection process, tool, and system that ensures consistent and repeatable color assignments for the geometric elements in a design layout or in a window of a design layout. According to disclosed embodiments, a position-independent process applies a set of coloring assignment rules that, in combination, ensure that each geometric element is consistently identified and colored. Disclosed processes provide a great advantage in processing speed and efficiency over current coloring processes that rely on pattern matching.

Coloring Selection Tool

Figure 6:
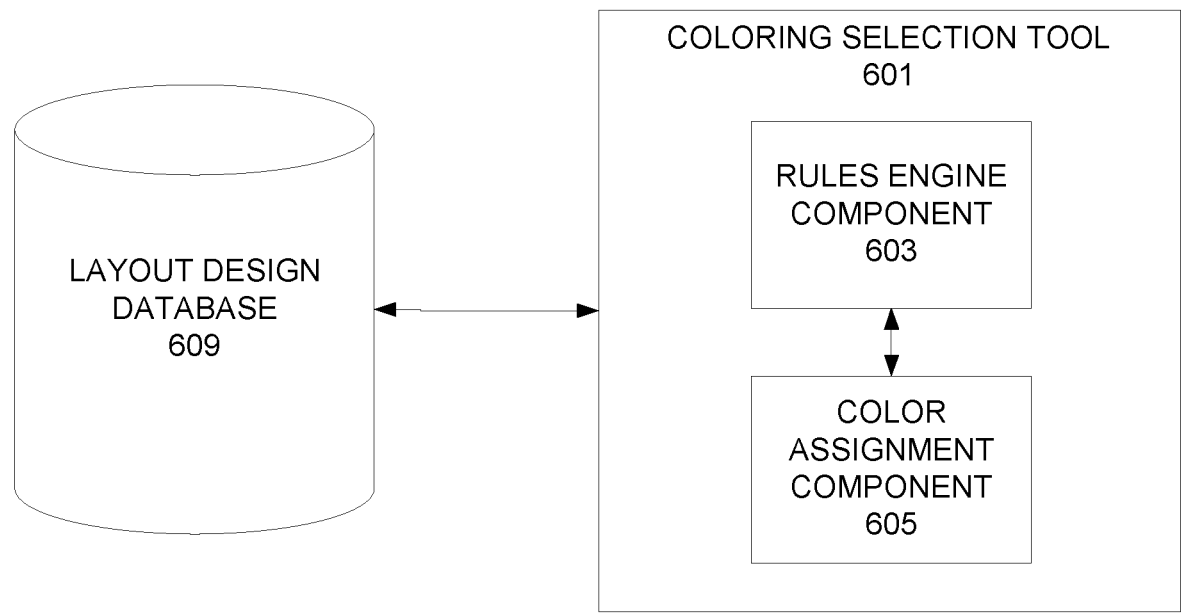
FIG. 6 illustrates an example of a coloring selection tool that may be employed to select coloring arrangements in a layout design in accordance with disclosed embodiments.

FIG. 6 illustrates an example of a coloring selection tool 601 that may be employed to select coloring arrangements in a layout design. As seen in this figure, the coloring selection tool 601 includes rules engine component 603 and a color assignment component 605. As will be explained in more detail below, the rules engine component 603 manages and stores rules for constraint generation, and identifies elements of the design layout that match the rule(s) being applied. The color assignment component 605 applies rules from the rules engine component 603 to assign patterning colors to geometric elements.

Various examples of the rules engine component 603 and color assignment component 605 may be embodied by a single or multiprocessor computing system, such as the computing system 101 illustrated in FIG. 1. Accordingly, one or more elements of each of the rules engine component 603 and color assignment component 605 may be embodied using one or more processors in a multiprocessor computing system's master computer, such as the master computer 103, one or more servant computers in a multiprocessor computing system, such as the servant computers 117, or some combination of both executing the appropriate software instructions. Of course, some examples of the coloring selection tool 601 may be implemented by, for example, one or more computer-readable devices having such software instructions stored thereon in a non-transitory manner, that is, stored over a period of time such that they may be retrieved for use at any arbitrary point during that period of time. It also should be appreciated that, while rules engine component 603 and color assignment component 605 are shown as separate units in FIG. 6, a single servant computer (or a single processor within a master computer) may be used to embody both of these components at different times, or aspects of both of these components at different times.

Still further, various examples of the rules engine component 603 and color assignment component 605 may be embodied by a hardware device, such as a field programmable gate array (FPGA) system configured to implement the functionality of the coloring selection tool 601. As will be appreciated by those of ordinary skill in the art, conventional field programmable gate arrays contain memory and programmable logic blocks that can be configured to operate as simple logic gates (such as AND and XOR gates) or to perform more complex combinational functions. Field programmable gate arrays also contain a hierarchy of reconfigurable interconnects that allow the blocks to be wired together in different configurations. Thus, some examples of the coloring selection tool 601 may be embodied by using field programmable gate arrays configured to have combinatorial logic circuits that perform the functionality of the rules engine component 603 and color assignment component 605 as described in more detail below. Still further, some examples of the rules engine component 603 and color assignment component 605, or some combination thereof may be embodied by an application-specific integrated circuit (ASIC) configured to perform aspects of the functionality of those tools.

The layout design database 609 may be implemented using any non-transitory storage device operable with the coloring selection tool 601. For example, the layout design database 609 may be implemented by microcircuit memory devices, such as read-write memory (RAM), read-only memory (ROM), electronically erasable and programmable read-only memory (EEPROM) or flash memory microcircuit devices, CD-ROM disks, digital video disks (DVD), or other optical storage devices. The layout design database 609 may also be implemented by magnetic cassettes, magnetic tapes, magnetic disks or other magnetic storage devices, punched media, holographic storage devices, or any combination of the foregoing devices.

Figure 7:
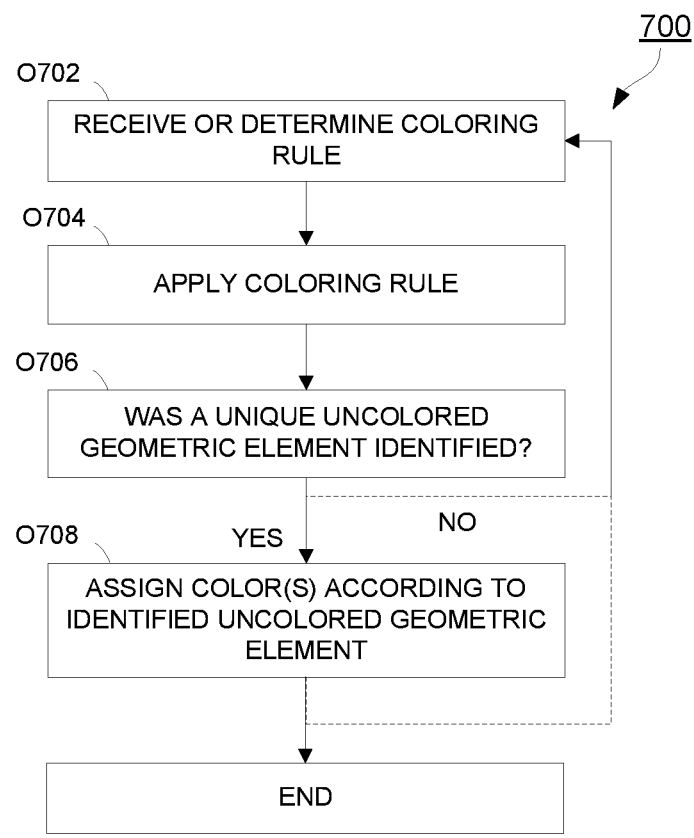
FIG. 7 illustrates a flowchart showing a process for assigning patterning colors to geometric elements in accordance with disclosed embodiments.

FIG. 7 illustrates a flowchart showing a process 700 for assigning patterning colors to geometric elements as disclosed herein. While different aspects of this process will be described with reference to the coloring selection tool 601 shown in FIG. 6, it should be appreciated that various implementations of this method may be performed without using the specific coloring selection tool 601. Similarly, constraint generation tool 601 may be used to implement alternate methods for assigning coloring arrangement to elements in layout design data.

Turning now to FIG. 7, in operation O702, the coloring selection tool receives or determines a coloring rule. In some embodiments, this is performed by a rules engine component 603 described herein. "Receiving," as used herein, can include loading from storage, receiving via an interaction with a user, receiving from another device or process, or otherwise. In specific embodiments, the coloring rule can be received from a user via a graphical user interface or command-line interface to the computer system.

Specifically, the coloring rules enable consistent and repeatable coloring of geometric elements of a design layout that is position- and orientation-independent, and so improve the functionality of the coloring selection tool and the computer system(s) on which it operates.

The coloring rules can be applied in any order, provided that the order is predetermined so that they are applied in the same order every time. Each of the coloring rules is used to specifically and uniquely identify the next geometric element to be colored, among those that have not been already colored, when possible. By applying the same rules in the same order, each time a process as disclosed is executed on a given design layout, the same elements will be identified and colored in the same sequence, regardless of the orientation or transformation of the design layout. Applying such rules in a process as disclosed provides the advantage of assigning automatic, uniform patterning colors to the design layout, which cannot be accomplished by current systems and is therefore specific functional improvement over known systems.

The coloring rules can include:
Identify the uncolored anchor geometric element (for example, the lowest-left element or an element that includes a specific coloring marker, whether in the layout as a whole, a window of the layout, or other defined region). This is typically the first rule to be applied, since the anchor element should be uniquely identified when the design layout is first loaded. For this reason, this rule (if applied) is only applied once.
Identify the uncolored geometric element nearest to a hotspot (such as hotspot 433).
Identify the uncolored geometric element nearest to a center of mass/gravity of the design layout (such as center of mass 431).
Identify the uncolored geometric element nearest to a specific already-colored element in the layout, such as any component or via, which is itself identified with relation to a hotspot or center of mass (such as nearest, or second nearest). That is, even if two or more uncolored elements have been identified in the result for each of the previous rules including distance from a location-independent points such as a hotspot or center of mass, they will not have the same distance from a different element that itself is identified from the hotspot or center of mass.

In operation O704, the coloring selection tool, for example by rules engine component 603, applies a coloring rule to the layout design data to identify an uncolored geometric element corresponding to the rule. This may be applied to the entire layout, a specific layer, a specific window in the layout or layer, or otherwise, and each of these cases can be processed as described unless specifically described otherwise.

In operation O706, the coloring selection tool 601, for example by rules engine component 603, determines if the applied rule uniquely identified an uncolored geometric element. That is, "uniquely identified" refers to identifying one, and only one, uncolored geometric element from the applied rule. If so, that identified uncolored geometric element is processed in operation O708, below.

If not, the coloring selection tool 601 returns to operation O702 to repeat the process using the next rule in the predetermined order. That is, if two or more uncolored geometric elements were identified that correspond to the rule, then the system moves on to the next rule to attempt to identify only a single uncolored geometric element.

Note that, in some embodiments, operation O704 can be applied in a subsequent execution to only the uncolored geometric elements identified in the previous execution of operation O704. For example, if two uncolored geometric elements were identified that correspond to a rule in a first pass of operation O704, then the system, can return to operation O702 to select a new rule, and operation O704 can be applied only to the previously-identified two uncolored geometric elements to attempt to uniquely identify one of them by the new rule. In such embodiments, the same approach should be used in each case that the process is run to ensure consisted color assignments.

In operation O708, the coloring selection tool 601, for example using color assignment component 605, assigns colors according to the identified uncolored geometric element. This can include assigning a patterning color to the identified uncolored geometric element according to defined multi-patterning technique. For example, in a double-patterning case, the first identified uncolored geometric element can be assigned a first color (e.g., "0") and the next identified uncolored geometric element can be assigned a second color (e.g., "1"). Similarly, the assignment of a color to each identified uncolored geometric component can be in turn through all the colors of the particular multi-patterning scheme, or can be to the same initial color in each case.

Assigning colors, in operation O708, is intended to include generating "hints" for a subsequent multi-patterning tool to assign colors based on these hints and any other inputs it can consume. In such cases, the assigned-color "hints" may be overridden by coloring priorities coming from other sources, such hard requirements on colors that contradict the assigned-color "hints" generated in operation O708. When overridden, the assigned-color hints can be treated as advisory.

Operation O708 can also include coloring all other geometric elements that are connected by constraints to the identified uncolored geometric element, directly or indirectly. That is, the particular multipatterning approach for any given layout can define how each geometric element has to be colored, according to the constraints that connect them to the identified uncolored geometric element, so once that an uncolored geometric element is identified and colored, the color assignment component 605 can propagate patterning color assignments through the web of constraint connections to assign colors to all connected geometric elements.

After colors are assigned for that identified geometric element, if there are any remaining, uncolored geometric elements, the process can return to operation O702 to repeat the process to identify the next uncolored geometric element. If all elements have been colored for at least a predetermined portion of the layout data (e.g., all the layout data, one or more layers of the layout data, a window of the layout data, or some other subset of all the layout data), the process can end, and the assigned colors can be stored with or associated with the layout design data. Similarly, the process by end when some stopping criterion is met, such as a user intervention or that a sufficient portion of the layout data has been colored. Thereafter, a lithographic process can be performed based on the layout design and the assigned colors.

A process as disclosed herein, by applying a set of rules as disclosed in a predetermined order, can efficiently ensure that the design layout is colored in the same way each time, regardless of rotation or reflection/mirroring effects. Such a process improves the operation of the coloring selection tool and the data processing system that operates it by ensuring repeatability and improving efficiency and accuracy over pattern-matching techniques.

CONCLUSION

While the technology disclosed herein has been described with respect to specific examples, including presently preferred modes, those skilled in the art will appreciate that there are numerous variations and permutations of the above described systems and techniques that fall within its spirit and scope as set forth in the appended claims. For example, while specific terminology has been employed above to refer to electronic design automation processes, it should be appreciated that various examples of the technology may be implemented using any desired combination of electronic design automation processes.

Other related techniques and processes are described in United States Patent Publication 2017/0242953, which is hereby incorporated by reference.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor," or "controller," within a claim is understood and intended to refer to structures known to those skilled in the relevant art, as further modified or enhanced by the features of the claims themselves, and is not intended to invoke 35 U.S.C. § 112(f).

What is claimed is:

1. A method for multi-patterning in layout design data, comprising:
receiving a coloring rule by a computer system;
applying the coloring rule to the layout design data in order to identify a unique uncolored geometric element corresponding to the rule, by the computer system;
when the applied rule did not identify the unique uncolored geometric element corresponding to the rule, repeat the receiving and applying processes with a different coloring rule in order to identify the unique uncolored geometric element; and
when the applied rule did identify the unique uncolored geometric element corresponding to the rule, assigning a patterning color to the unique uncolored geometric element, by the computer system.

2. The method of claim 1, wherein the receiving, applying, and assigning processes are repeated until all geometric elements in at least a predetermined portion of the layout design data have been assigned a patterning color.

3. The method of claim 1, wherein the receiving, applying, and assigning processes are repeated until a stopping criterion is met.

4. The method of claim 1, further comprising propagating patterning coloring assignments through other uncolored geometric elements that are connected to the unique uncolored geometric element directly or indirectly by coloring constraints.

5. The method of claim 1, wherein the coloring rule is one of:
identify an uncolored anchor geometric element;
identify an uncolored geometric element nearest to a hotspot;
identify an uncolored geometric element nearest to a center of mass/gravity of the design layout; or
identify an uncolored geometric element nearest to a specific already-colored element in the layout.

6. The method of claim 1, wherein each time the receiving process is performed, a different coloring rule is used in a predetermined order.

7. The method of claim 1, further comprising storing the assigned patterning colors with the layout design data.

8. A computer system comprising:
a processor; and
an accessible memory, the data processing system configured to receive a coloring rule;
apply the coloring rule to the layout design data in order to identify a unique uncolored geometric element corresponding to the rule;
when the applied rule did not identify the unique uncolored geometric element corresponding to the rule, repeat the receiving and applying processes with a different coloring rule in order to identify the unique uncolored geometric element; and
when the applied rule did identify the unique uncolored geometric element corresponding to the rule, assign a patterning color to the unique uncolored geometric element.

9. The computer system of claim 8, wherein the receiving, applying, and assigning processes are repeated until all geometric elements in at least a predetermined portion of the layout design data have been assigned a patterning color.

10. The computer system of claim 8, wherein the receiving, applying, and assigning processes are repeated until a stopping criterion is met.

11. The computer system of claim 8, wherein the data processing system is further configured to propagate patterning coloring assignments through other uncolored geometric elements that are connected to the unique uncolored geometric element directly or indirectly by coloring constraints.

12. The computer system of claim 8, wherein the coloring rule is one of:
identify an uncolored anchor geometric element;
identify an uncolored geometric element nearest to a hotspot;
identify an uncolored geometric element nearest to a center of mass/gravity of the design layout; or
identify an uncolored geometric element nearest to a specific already-colored element in the layout.

13. The computer system of claim 8, wherein each time the receiving process is performed, a different coloring rule is used in a predetermined order.

14. The computer system of claim 8, wherein the data processing system is further configured to store the assigned patterning colors with the layout design data.

15. A non-transitory computer-readable medium storing with executable instructions that, when executed, cause one or more computer systems to:
receive a coloring rule;
apply the coloring rule to the layout design data in order to identify a unique uncolored geometric element corresponding to the rule;
when the applied rule did not identify the unique uncolored geometric element corresponding to the rule, repeat the receiving and applying processes with a different coloring rule in order to identify the unique uncolored geometric element; and
when the applied rule did identify the unique uncolored geometric element corresponding to the rule, assign a patterning color to the unique uncolored geometric element.

16. The non-transitory computer-readable medium of claim 15, wherein the receiving, applying, and assigning processes are repeated until all geometric elements in at least a predetermined portion of the layout design data have been assigned a patterning color.

17. The non-transitory computer-readable medium of claim 15, further storing instructions to propagate patterning coloring assignments though other uncolored geometric elements that connected to the unique uncolored geometric element directly or indirectly by coloring constraints.

18. The non-transitory computer-readable medium of claim 15, wherein the coloring rule is one of:
identify an uncolored anchor geometric element;
identify an uncolored geometric element nearest to a hotspot;
identify an uncolored geometric element nearest to a center of mass/gravity of the design layout; or
identify an uncolored geometric element nearest to a specific already-colored element in the layout.

19. The non-transitory computer-readable medium of claim 15, wherein each time the receiving process is performed, a different coloring rule is used in a predetermined order.

20. The non-transitory computer-readable medium of claim 15, further storing instructions to store the assigned patterning colors with the layout design data.

* * * * *